United States Patent
Wang et al.

(10) Patent No.: US 11,315,748 B2
(45) Date of Patent: Apr. 26, 2022

(54) ELECTRON SOURCE REGENERATION METHOD

(71) Applicant: 38th Research Institute, China Electronics Technology Group Corporation, Anhui (CN)

(72) Inventors: Xuehui Wang, Anhui (CN); Zhao Huang, Anhui (CN); Junting Wang, Anhui (CN); Tingting Luo, Anhui (CN); Huarong Liu, Anhui (CN); Xingjia Yao, Anhui (CN); Yijing Li, Anhui (CN); Lei Zheng, Anhui (CN); Chunning Zheng, Anhui (CN)

(73) Assignee: 38th Research Institute, China Electronics Technology Group Corporation, Anhui (CN)

( * ) Notice: Subject to any disclaimer, the term of this patent is extended or adjusted under 35 U.S.C. 154(b) by 0 days.

(21) Appl. No.: 16/966,911

(22) PCT Filed: Dec. 27, 2018

(86) PCT No.: PCT/CN2018/124354
§ 371 (c)(1),
(2) Date: Aug. 3, 2020

(87) PCT Pub. No.: WO2020/073514
PCT Pub. Date: Apr. 16, 2020

(65) Prior Publication Data
US 2021/0050173 A1    Feb. 18, 2021

(30) Foreign Application Priority Data
Oct. 12, 2018  (CN) .......................... 201811190762.7

(51) Int. Cl.
*H01J 9/50* (2006.01)
*H01J 1/304* (2006.01)

(52) U.S. Cl.
CPC ............... *H01J 9/505* (2013.01); *H01J 1/304* (2013.01)

(58) Field of Classification Search
CPC ........................... H01J 9/50–505; H01J 9/045
See application file for complete search history.

(56) References Cited

U.S. PATENT DOCUMENTS 6,281,626 B1  8/2001  Nakamura et al.
6,573,642 B1  6/2003  Vonallmen et al.
(Continued)

FOREIGN PATENT DOCUMENTS

CN   1937165 A   3/2007
CN   101506927 A   8/2009
(Continued)

OTHER PUBLICATIONS

"First Office Action and English language translation", CN Application No. 201811190762.7, dated Sep. 2, 2020, 17 pp.
(Continued)

*Primary Examiner* — Mariceli Santiago
(74) *Attorney, Agent, or Firm* — Myers Bigel, P.A.

(57) ABSTRACT

The present disclosure provides a method of regenerating an electron source, the electron source including at least one emission site fixed on a needle tip, and the emission site including a reaction product formed by metal atoms and gas molecules. The method includes regenerating the electron source in situ if an emission capability of the electron source satisfies a regeneration condition.

9 Claims, 4 Drawing Sheets

(56) References Cited

U.S. PATENT DOCUMENTS

| | | | |
|---|---|---|---|
| 7,777,404 B1 | 8/2010 | Fujieda et al. | |
| 8,013,505 B2 | 9/2011 | Wei et al. | |
| 8,766,542 B2 | 7/2014 | Cho et al. | |
| 9,023,226 B2 | 5/2015 | Liu et al. | |
| 9,257,257 B2 | 2/2016 | Fujita et al. | |
| 9,378,858 B2 | 6/2016 | Aramaki et al. | |
| 9,773,634 B2 | 9/2017 | Kozakai et al. | |
| 2009/0153015 A1* | 6/2009 | King | F03H 1/00 313/359.1 |
| 2011/0101238 A1 | 5/2011 | Tessner et al. | |
| 2013/0020496 A1 | 1/2013 | Liu et al. | |
| 2014/0191128 A1* | 7/2014 | Kawanami | H01J 37/26 250/309 |
| 2015/0002009 A1* | 1/2015 | Zhang | H01J 9/025 313/46 |
| 2015/0054398 A1 | 2/2015 | Yan | |
| 2017/0076901 A1* | 3/2017 | Hirsch | C25D 5/50 |

FOREIGN PATENT DOCUMENTS

| | | | |
|---|---|---|---|
| CN | 101540251 A | 9/2009 | |
| CN | 102789946 A | 11/2012 | |
| CN | 103748653 A | 4/2014 | |
| CN | 104347335 A | 2/2015 | |
| CN | 104425199 A | 3/2015 | |
| EP | 2546862 A1 | 1/2013 | |
| JP | S5912533 A | 1/1984 | |
| JP | 2003100244 A | 4/2003 | |
| JP | 2008140557 A | 6/2008 | |
| JP | 2011171088 A | 9/2011 | |
| JP | 2011-238480 A | 11/2011 | |
| JP | 5551830 B2 | 5/2014 | |
| JP | 5564689 B2 | 6/2014 | |
| WO | WO-2011033989 A1 * | 3/2011 | ............ H01J 37/065 |

OTHER PUBLICATIONS

"Communication with Supplementary European Search Report", EP Application No. 18936812.9, dated May 17, 2021, 12 pp.

"Notice of Reasons for Refusal and English language translation", JP Application No. 2020-542140, dated Jun. 18, 2021, 6 pp.

International Search Report (English translation) and Written Opinion, International Application No. PCT/CN2018/124354, dated Jul. 11, 2019, 5 pp.

* cited by examiner

ELECTRON SOURCE REGENERATION METHOD

RELATED APPLICATIONS

The present application is a 35 U.S.C. 371 national stage application of PCT International Application No. PCT/CN2018/124354, filed on Dec. 27, 2018, which claims the benefit of Chinese Patent Application No. 201811190762.7, filed on Oct. 12, 2018, the entire disclosures of both of which are incorporated herein by reference.

TECHNICAL FIELD

The present disclosure relates to the field of electron source technology, and more particularly, to an electron source regeneration method.

BACKGROUND

Free electrons in metal may be emitted under certain conditions. If a cathode is made of metal and made into a very fine tip and it is applied by a voltage of thousands of volts in a vacuum, then the electrons in the metal may be emitted from the cathode cold metal. This method of emitting electrons is called as field emission, belonging to cold cathode emission.

For the electron source, the most important parameter is brightness, which directly determines the beam quality. At an extraction voltage of V0, the brightness may be denoted in formula (1):

$$B = \frac{I}{S \times \Omega} \propto \frac{I}{d^2 \times \alpha^2} \quad (1)$$

Where B refers to the brightness, I refers to an emission current, S refers to an equivalent emission area, d refers to an equivalent diameter, $\Omega$ refers to a solid angle, and $\alpha$ refers to an half opening angle. Further, the brightness B is proportional to an acceleration voltage $V_a$, as shown in the formula (2).

$$B \propto V_a \quad (2)$$

As can be seen from the formula (1), in order to obtain a high brightness, it is necessary to increase I and reduce $\alpha$ and d as much as possible. Moreover, the lower the extraction voltage V0 is required to obtain a certain emission current, the better it is, which requires that an emission surface of the tip has a lower work function and a sharper head structure. In addition, another key parameter of the electron source is monochromaticity, which can be expressed by an energy spread $\delta E$.

Based on the above, the most ideal electron source is the cold field emission electron source (abbreviated as CFE). The brightness of CFE is higher than that of other types of electron sources by about one order of magnitude, and it has a small energy spread (~0.3 eV). In addition, in order to seek for the extreme diameter as far as possible, atomic-scale electron sources having a low work function recently have become the research hotspots, that is, the emission site consists of only one or several atoms.

In the process of implementing the concept of the present disclosure, the inventors have found that the CFE in the related art has at least the following disadvantages: firstly, the stability of the CFE is often poor, and it is required to work under extremely high vacuum ($10^{-9} \sim 10^{-8}$ Pa), which severely limits the scope of application thereof. Even in such an environment, it needs to be processed regularly to obtain a more stable working state. Secondly, due to the impact of ion bombardment, the CFE is easier to be burned out. Thirdly, the aforementioned disadvantages become more serious at a larger emission current, the current CFE generally needs a total emission current of ~10 microamperes for stable operation for a long time, and the utilization ratio thereof is very low. In view of the aforementioned drawbacks, the Schottky thermal-field emission source is dominant in the field of high-brightness electron sources.

SUMMARY

An aspect of the present disclosure provides an electron source regeneration method capable of making a CFE stable work in a low vacuum environment, having a large field emission current and being reusable; the regeneration method being applicable to an electron source comprising at least one emission site fixed on a needle tip, the emission site being a reaction product of metal atoms on a surface of the tip and gas molecules formed under an electric field, and correspondingly, the electron source regeneration method comprises: regenerating the electron source in situ if an emission capability of the electron source satisfies a regeneration condition. Since the emission site is a reaction product of metal atoms fixed on the surface of the tip and gas molecules, it is rooted on the surface of the tip, and not the gas molecules or dissociative particles that are dissociative on the surface of the tip, and thus overcurrent burnout which is caused by a new emission site otherwise formed due to the accumulation of dissociative substances can be avoided, which effectively improves stability. In addition, the emission site includes a reaction product of metal atoms on the surface of the tip and gas molecules, and thus when compared to metal atoms or other metal compounds (such as metal boride), has a better stability in a working environment (including the presence of gas molecules), for example it is less likely to interact or react with gas molecules such as hydrogen in the working environment, further improving the stability of the electron source. In addition, the emission site of the electron source provided by the present disclosure may be a reaction product of one or more metal atoms and gas molecules, that is, an atomic-level electron source having a low work function can be formed. In addition, the reaction product significantly reduces the surface work function, and the formation of emitting site tapers on the surface also significantly increases the emission capability. In addition, the current value of the field emission current can be increased by increasing the number of emission sites. This makes it possible to form a stable electron source with a large field emission current. The current value of the field emission current can be increased by increasing the number of emission sites. In this way, the CFE can be stably operated in a lower vacuum environment and have a larger field emission current by controlling the operating parameters of the above electron source. When emission capability of the emission site of the CFE is degraded after long-term operation, the CFE can be regenerated in situ. The in-situ regeneration includes two meanings: in a first meaning, the electron source can be directly regenerated in a device without being taken out of the device; in a second meaning, the regenerated emission site is a new emission site that is re-formed at the location of the degraded emission site of the electron source. The performance of the new emission site is consistent with the performance of the emission site before degradation. This allows that the CFE operates stably in a lower vacuum environment with a larger field emission current and can be reused.

Optionally, in one embodiment, the regenerating the electron source in situ comprises: self-forming a protrusion in situ at the needle tip when the emission capability of the electron source satisfies the regeneration condition, wherein an outer surface of the protrusion includes the metal atoms; and then forming an emission site on the outer surface of the protrusion, wherein the emission site includes a reaction product of the metal atom and the gas molecule. In another embodiment, the regenerating the electron source in situ comprises: self-forming a highly-reactive active region in situ on a base of the needle tip when the emission capability of the electron source satisfies the regeneration condition, wherein an outer surface of the active region includes the metal atom; and then forming an emission site on the outer surface of the active region, wherein the emission site includes a reaction product of the metal atoms and the gas molecules.

Optionally, the self-forming a protrusion in situ at the needle tip may include self-forming the protrusion in situ at the needle tip by heating, by applying a bias voltage, or by a combination thereof.

Optionally, the protrusion may have a size of an order of magnitude of a sub-nanometer to 100 nanometers.

Optionally, a material of which the protrusion is made is the same as or different from a material of which the base is made; and/or the needle tip has a material or orientation that is capable of self-forming the protrusion; and/or the metal atoms of the outer surface of the protrusion are formed by an electroplating and/or evaporation process.

Optionally, the emission site is formed by applying an electric field to the needle tip in a hydrogen-containing atmosphere within a first pressure range; when the temperature of the needle tip is lower than or equal to 1,000K, the first pressure range is lower than or equal to $1E^{-3}$ Pa; or when the temperature of the needle tip is higher than or equal to 500K and lower than or equal to 800K, the first pressure range is lower than or equal to $10^{-6}$ Pa; or when the temperature of the needle tip is lower than or equal to 150K, the first pressure range is lower than or equal to $10^{-6}$ Pa.

Optionally, the method may further include: before or after regenerating the electron source in situ, applying an electric field to the electron source to cause gas molecules to be adsorbed on the emission site so as to remove at least one emission site that is not located at a axial center position of the surface of the needle tip. Under the action of the electric field, the gas molecules on the surface of the tip will move through the peripheral emission site in the process of moving to the emission site located at the axial position of the tip, thus these gas molecules will be first be adsorbed onto the surface of the emission site that is not located at the axial position of the surface of the tip, the emission ability of the emission site will be lowered and even disappear, so that at least some of the unwanted emission sites can be removed.

Optionally, the method may further include: when the electron source regenerated in situ satisfies the regeneration condition, regenerating the electron source in situ again, thereby reuse of the electron source can be achieved.

Optionally, the method may further include: performing a heat treatment on the electron source prior to regenerating the electron source in situ; as such, it is possible to try to recover the emission capability of the electron source firstly by using a treatment method that minimizes damage or has no damage to the emission site, and if the heat treatment cannot recover the emission capability of the emission site, the regeneration of the electron source may be achieved in a manner that damages the emission site.

Optionally, the method may further include: after performing the heat treatment on the electron source, firstly repairing the emission site of the electron source if an emission capability of the electron source satisfies a emission site repairing condition, wherein the repairing the emission site of the electron source comprises: firstly removing the emission site of the electron source; and then forming a new emission site on the surface of the protrusion or the highly reactive active region. In this way, a heat treatment method that has litter or not damage to the electron source may be firstly used to restore the emission capability of the emission site, and if the emission capability of the electron source cannot be recovered, the emission site repairing method with a slightly larger damage to the electron source may be used to restore the emission capability of the electron source. Thereby, it is possible to attempt to complete the recovery of the emission capability of the electron source with minimal cost.

Optionally, the method may further include: after repairing the emission site of the electron source, regenerating the electron source in situ if the emission capability of the electron source satisfies the regeneration condition. If the way of repairing the emission site does not enable the electron source to resume the emission capability, then the electron source regeneration method is used to restore the electron source's emission capability, so that the electronic source can be reused.

Optionally, the material of the base is a conductive material, or the material of the high-field-strength structure is a conductive material, or the surface of the base and/or high-field-strength structure includes metal atoms, or the material of the high-field-strength structure is the same as or different from the material of the base; or the metal atomic material on the surface of the base and/or the high-field-strength structure may the same as or different from the material of the high-field-strength structure, and if being different, the metal atoms on the surface of the base and/or the high-field-strength structure may be formed by evaporation or electroplating; or, the metal atomic material on the surface of the base and/or the high-field-strength structure may be the same as or different from the material of the base, and if being different, the metal atoms on the surface of the base and/or the high-field-strength structure may be formed by evaporation or electroplating.

Optionally, the material of the base is a conductive material and has a melting point higher than 1000 K, or the material of the high-field-strength structure is a conductive material and has a melting point higher than 1000 K, or the material the metal atoms on the surface of the base and/or the high-field-strength structure is a metal material having a melting point higher than 1000 K, and the reaction product of the metal atoms and the gas molecules includes a reaction product of metal atoms having a melting point higher than 1000 K and gas molecules under vacuum.

The electron source regeneration method provided by the present disclosure can make the CFE stable operation in a lower vacuum environment with a large field emission current, and can be reused, wherein the CFE can include at least one emission site fixed on the needle tip. The emission site is a reaction product of metal atoms on the surface of the tip and gas molecules under an electric field.

BRIEF DESCRIPTION OF THE DRAWINGS

For a more complete understanding of the present disclosure and its advantages, reference will now be made to the following description made in combination with the drawings, in which.

DETAILED DESCRIPTION OF EMBODIMENTS

Figure 1:
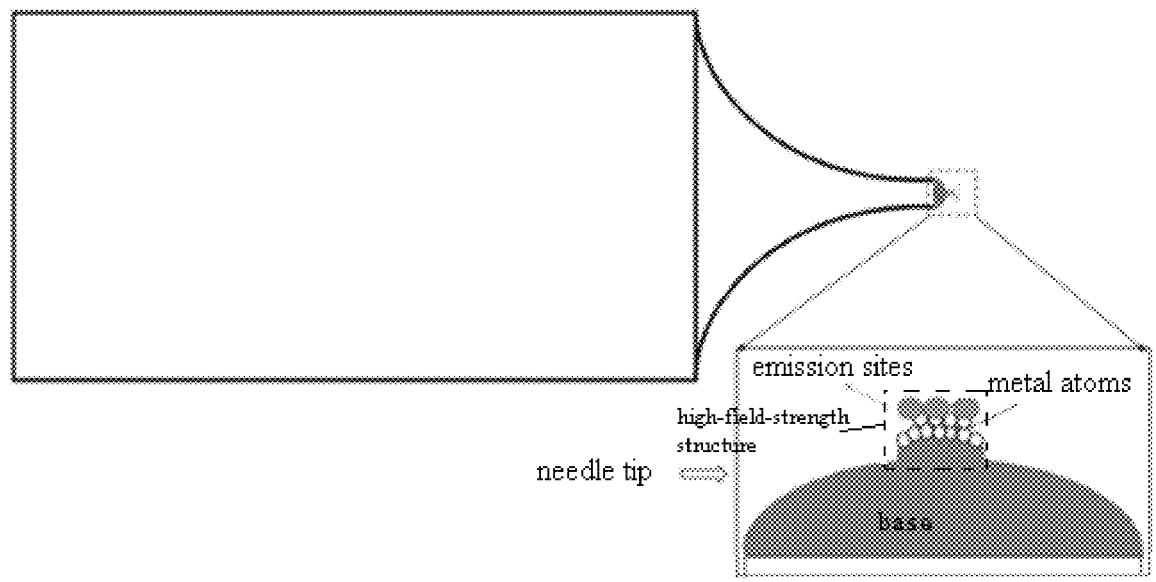
FIG. 1 schematically shows a schematic structural view of an electron source according to an embodiment of the present disclosure.

Hereinafter, the embodiments of the present disclosure will be described with reference to the accompanying drawings. However, it should be understood that the description is only exemplary, and is not intended to limit the scope of the present disclosure. In the following detailed description, numerous specific details are set forth for facilitating the explanation to provide a thorough understanding of the embodiments of the present disclosure. However, it is apparent that one or more embodiments may be practiced without these specific details. In addition, the description of well-known structures and techniques is omitted in the specification in order to avoid unnecessarily misunderstanding the concept of the present disclosure.

The terms used herein are merely for the purpose of describing the particular embodiments, rather than limiting the present disclosure. The terms "comprise", "include" and the like used herein indicate the presence of the described feature, step, operation and/or component, but rather excluding the presence or addition of one or more features, steps, operations and/or components.

All the terms (comprising technical and scientific terms) used herein have the meanings commonly understood by those skilled in the art, unless otherwise defined. It should be noted that the terms used herein are to be interpreted as having meanings consistent with the context of the present specification and should not be interpreted in an ideal or too inflexible manner.

In a case where an expression like "at least one of A, B, C, etc." is used, it should generally be interpreted according to the meaning of the expression as commonly understood by those skilled in the art (for example, "an operation having at least one of A, B, and C" shall comprise, but is not limited to, an operation having A alone, B alone, C alone, A and B, A and C, B and C, and/or A, B, and C). In a case where an expression like "at least one of A, B, C, etc." is used, it should generally be interpreted according to the meaning of the expression as commonly understood by those skilled in the art (for example, "an operation having at least one of A, B, and C" shall comprise, but is not limited to, an operation having A alone, B alone, C alone, A and B, A and C, B and C, and/or A, B, and C).

Some block diagrams and/or flowcharts are shown in the drawings. It will be understood that some blocks or combinations of the block diagrams and/or flowcharts can be implemented by computer program instructions. These computer program instructions may be provided to a general purpose computer, a special purpose computer or a processor of other programmable data processing apparatus, such that when executed by the processor, the instructions may be used to construct devices for implementing the functions/operations illustrated in the block diagrams and/or flowcharts.

The field emission behavior in the related art will be firstly described below in order to better understand the technical solutions of the present disclosure.

The existing electron source, for example, an electron source of a (310) oriented single-crystal tungsten, will undergo the following three stages during use. Firstly, the cleaner electron source goes into a stability period (Stability) in company with the adsorption of gas. However, with the further adsorption of gas, current noise gradually appears, entering an instability period (Instability). Then, the stability of the electron source is deteriorated, and contaminants would gradually appear on the surface with the work time increasing, and the emission current would start to fluctuate drastically, eventually leading to burnout.

Regarding the above burnout, the inventors' further studies have shown that it is closely related to ion bombardment. This is due to the fact that the gas molecules in the surrounding space will be ionized after the electrons are emitted, and then bombard the tip. One possibility is that the surface of the tip is bombarded to form a plurality of protrusions, and the plurality of protrusions respectively serve as emission sites, and finally excessive current is caused, resulting in the burnout. There is also a mechanism in which the gas molecules adsorbed to the surface of the tip or a combination thereof with other substances are continuously moved under an electric field, and finally gathered into a nano-scale protrusion as an emission site on a defect point on a surface (for example, generated by ion bombardment), and the rapid growth of the emission site causes an over-current, which eventually leads to the burnout of the tip.

Further, the aforementioned problems become more serious at a larger emission current. Generally, the total emission current for stable operation for a long time is ~10 microamperes, and the utilization rate is very low. In view of the aforementioned drawbacks, the Schottky thermal-field emission source is dominant in the field of high-brightness electron sources.

Essentially, for the cold field emission electron sources (CFE), no material can avoid the effects of gas adsorption and ion bombardment. However, if the operation is under high current (>10 microamperes), the electron excitation degassing (especially taking place at the extraction electrode with electron bombardment) will further degrade the vacuum degree, which results in poor emission stability of the tip, and extremely large fluctuation, thereby failing to operate stably for a long time. Therefore, how to provide a stable and large field emission current has been one of the most important challenges in the development of cold field emission electron sources.

In order to avoid the above effects of gas adsorption and ion bombardment, the current field emission electron source (generally referring to a metal tip) can only work in ultra-high vacuum ($<10^{-8}$ Pa), which seriously restricts the application range of the CFE. Further intensive research relating to this has been carried out by the inventors, and the following characteristics are found. The components of the residual gas in the vacuum comprise $H_2$, CO and $CO_2$, and the main component is $H_2$. The adsorption of $H_2$ causes the emission capability of the clean surface to gradually deteriorate. It can be concluded that in this vacuum range, the influence of $H_2$ fundamentally determines the field emission performance of the tip. Therefore, how to deal with the influence of $H_2$ becomes the key to achieve a high stability of tip. There are also some technical solutions in the related art that can alleviate the problem of gas adsorption, for example, by further increasing a vacuum degree of a chamber to an order of $1\times10^{-9}$ Pa.

In addition, there are some technical solutions in which some dissociative particles (atomic clusters) on the surface of the tip are used as the emission sites, which is also a solution way to be attempted. These dissociative substances may be contaminants formed by prolonged placement under poor vacuum degree, and the action of the electric field allows these dissociative substances to move somewhere on the tip. These emission sites have a very small beam angle (~5°), the extraction voltage is extremely low, and the brightness can reach more than 10 times that of the conventional W (310). Although it is not possible to form a large emission current (generally steadily giving the current of ~10 nA), it exhibits excellent stability ($<1\times10^{-7}$ Pa). One possible inference is that the very small beam angle and emission area can effectively reduce the effects of ion bombardment. However, as mentioned above, this kind of dissociative substances is not fixed, and the inventors have found that when the current is large (>1 uA), the electron source is easily burned out, and in the operation process, such substances continuously appear, its emission state is gradually changed, and it is difficult to maintain it for a long time. Another problem is that when it is exposed to the atmosphere, it is highly susceptible to the interference of the gas since the size of the substance is comparable with the gas molecules.

Based on the above various analysis, reasoning and experiments, the inventors have provided the electron source regeneration method of the present disclosure to realize the reuse of the electron source, and the electron source can work stably for a long period of time, provide a large field emission current, and work in a poorer vacuum environment.

Embodiments of the present disclosure provide an electron source regeneration method, which can be applied to an electron source, which may include at least one emission site fixed on a needle tip, the emission site being a reaction product formed by metal atoms on a surface of the tip and gas molecules under an electric field, the method comprising regenerating the electron source in situ if the emission capability of the electron source satisfies the regeneration condition. Among others, the electron source has the following advantages: firstly, the emission site is directly generated by the reaction of gas molecules and surface metal atoms under a strong electric field, and thus rooted on the surface of the needle tip without moving on the surface; secondly, the emission site itself has a strong environmental adaptability and can work under a poor vacuum ($<10^{-5}$ Pa). Again, the electron source may work with a typical field emission behavior, such that the extraction voltage is extremely low, the extraction voltage is reduced by about 30% compared to the conventional tip, and the maximum emission current is up to the mA level. However, in the process of using the electron source, there are still the following problems: first, after the electron source is used for a long time, its emission capability is deteriorated, so that the emission capability of the electron source is lowered or the current cannot be emitted. The electron source regeneration method provided by the present disclosure can restore the emission capability of a degrading electron source to a normal emission level.

FIG. 1 schematically shows a schematic structural view of an electron source according to an embodiment of the present disclosure.

As shown in FIG. 1, a tip may include one or more emission sites that are fixed on the surface of the tip, which can be the reaction product of metal atoms at the surface of the tip with gas molecules.

In one embodiment, the reaction product formed by the metal atoms on the surface of the tip and the gas molecules obtained by applying an electric field may be implemented in various ways, for example, a voltage is applied directly to the tip to form a higher field strength on the surface of the tip so that the reaction product is obtained by the reaction of the metal atom on the surface of the tip with the surrounding gas molecules; or a voltage is applied to the field strength generating structure (such as an electrode) near the tip to form an electric field, thereby forming a high field strength on the surface of the needle tip so that a reaction product is obtained by the reaction of metal atoms on the surface of the tip with surrounding gas molecules. In short, the field formed on the surface of the tip and how the field is formed are not limited herein as long as a field (e.g., an electric field) can be formed on the surface of the tip, so as to cause the metal atoms on the surface of the tip to react with surrounding gas molecules to form a reaction product.

In an embodiment in which a field is formed by applying a voltage to a tip, in the illustrative example, the electric field is generated by applying a positive bias voltage, applying a negative bias voltage, or a combination of applying a positive bias voltage and a negative bias voltage, to the tip. In an example, if a positive bias voltage is applied, the field strength of the electric field comprises a range from 1 V/nm to 50 V/nm, and if a negative bias voltage is applied, the field strength of the electric field comprises a range from 1 V/nm to 30 V/nm.

The emission site may be formed at a specified position of the needle tip, for example, within a certain range where the needle axis intersects the surface of the needle tip, or may be formed on a specific structure such as a protrusion having a field strength advantage for preferential formation of reaction product of metal atoms and gas molecules, or may also be formed in a specific reactive region, such as a specific metal atom region which is more likely to react with gas molecules, or a combination of the above two cases may be used. This will be not limited here.

The metal atom may be a metal atom on the surface of the tip body, that is, the type of the metal atom is the same as the type of the tip body, and may be a different kind of metal atom formed on the surface of the tip by evaporation, electroplating or the like. Preferably, the material of metal atom has a melting point higher than 1000 K, and thus has a better stability such that the tip is convenient for cleaning by heat treatment or the like. For example, the metal material of high melting point may include any one or more of the following: tungsten, iridium, tantalum, molybdenum, niobium, hafnium, chromium, vanadium, zirconium, titanium, rhenium, palladium, platinum, rhodium, osmium, ruthenium, gold, hexaboride metal or the like. For example, a certain kind of metal atom is alone used as metal atoms on the surface of the tip, or a laminated layer is formed of several kinds of metal atoms of the above materials, such as a laminated layer formed by a titanium layer, a platinum layer, a tungsten layer, etc., or a non-monoplasmatic metal layer is formed by mixing several kinds of metal atoms of the above materials, which is not limited herein.

The gas molecules may be introduced by a gas introduction device. The gas molecules may be such as specific gas molecules introduced through a gas flow valve or the like, gas molecules generated by desorption of a surface of some components, or a gas molecules remaining in a vacuum chamber, or a combination of the above two gas molecules, which will not be limited herein. In an example, the gas molecules may include hydrogen-containing gas molecules, and any one or more of the following gas molecules: nitrogen-containing gas molecules, carbon-containing gas molecules, or oxygen-containing gas molecules. The above gas molecules may be introduced gas molecules, and therefore, the amount of gas introduced may be dynamically adjusted, and generally, when the gas is introduced, the degree of vacuum is less than $10^{-4}$ Pa. If the residual gas in the vacuum chamber is directly utilized, the main residual gas in the vacuum chamber is hydrogen. Preferably, the above hydrogen-containing gas molecules include hydrogen.

It should be noted that the emission sites may disappear at certain temperature, and the temperature at which the emission site disappears, such as a decomposition temperature, may be lower than the temperature at which the tip body disappears in order to remove the emission site, and the temperature at which the emission site disappears may be higher than the temperature at which the emission site works and higher than the temperature at which the adsorbed gas molecules are desorbed, thereby it is convenient to recover the electron source to a stable state by a simple desorption treatment such as heat treatment.

The electron source regeneration method may include regenerating the electron source in situ if the emission capability of the electron source satisfies the regeneration condition. For example, high-field-strength structures and/or active regions with large reaction activity are removed, then high-field-strength structures and/or active regions with high reaction activity are re-formed in situ, and next, an emission site is re-formed on the high-field-strength structure and/or the active region with high reaction activity, wherein the emission site is a reaction product of metal atoms on the surface of the tip and gas molecules under an electric field. The electron source provided by the present disclosure can be reused by means of the electron source regeneration method, and can stably operate in a low vacuum environment and have a large field emission current. The regeneration conditions may include: the emission current of the electron source drops below a set threshold. In addition, the regeneration conditions may include other limitations, such as regeneration after the emission current of the electron source drops below a set threshold after heat treatment and/or reformation of the emission site.

In one embodiment, the in-situ regeneration of electron source may include following operations: forming a protrusion in situ at the needle tip when the emission capability of the electron source satisfies a regeneration condition, wherein an outer surface of the protrusion includes metal atoms; then forming an emission site on the outer surface of the protrusion, wherein the emission site includes a reaction product of metal atoms and gas molecules.

In an example, the forming a protrusion in situ at the tip comprises: forming a protrusion in situ at the tip by heating, applying a bias voltage or a combination thereof, or by a method of, for example, plating a layer of metal atoms on a single crystal metal tip and reshaping the layer of metal atoms by heat treatment to form the protrusion. It should be noted that any method that can form a protrusion on the surface of the needle tip in situ is applicable, and will not be limited herein. The gas molecules may be gas molecules in the working environment of the electron source, such as introduced gas molecules or gas molecules remaining in the vacuum chamber. Preferably, the protrusions have sizes ranging from sub-nanometer order to 100 nanometers order, for example, protrusions sized in atomic level, or protrusions sized in a level of tens of nanometer size, or the like.

In another embodiment, the in-situ regeneration of electron source may include following operations: forming a active region with larger reaction activity in situ on a base of the tip when the emission capability of the electron source satisfies a regeneration condition, wherein an outer surface of the active region comprises metal atoms; then forming an emission site on the outer surface of the active region, the emission site comprising a reaction product of metal atoms and gas molecules. In the reaction of the metal atoms with gas molecules under vacuum, the metal atoms on the surface of the active region are more reactive than the other surface portions of the base. The metal atoms of the active region may be formed by evaporation or electroplating. For example, a metal atom layer having a certain area may be formed by electroplating at the intersection of the axis of the tip and the surface, the material of the metal atom layer has higher reaction activity with gas molecules when compared with other surface materials of the base. Accordingly, during the reaction with gas molecules under vacuum conditions, the metal atoms on the surface of the active region of the base are more reactive than the surface of other portions of the base.

It should be noted that the material of the protrusion may the same as or different from the material of the base, and/or the tip has a material or orientation that can self-form the protrusion, and/or the metal atoms on the outer surface of the protrusion may be formed by an electroplating and/or evaporation method.

Specifically, the material or orientation (e.g., tungsten 111 orientation) at which the protrusion can be self-formed at the tip of the electron source is firstly selected, wherein the material of the protrusion may be the same as or different from the base, for example, the protrusion of the tip may be formed by other metal atoms electroplated on the surface of the tip.

The regeneration environment conditions regarding the electron source regeneration method may be as follows. If protrusions are formed in a vacuum environment, the degree of vacuum would be lower than $1E^{-3}$ Pa, and preferably, the degree of vacuum is lower than $1E^{-6}$ Pa. Then, by heating, or applying a certain electric field, or a combination of both, a protrusion is formed on the needle tip, and then an emission site is formed on the surface of the protrusion.

Specifically, the emission site is formed by applying an electric field to the tip in an atmosphere containing hydrogen within a first pressure range; for example, if the temperature of the tip is lower than or equal to 1,000 K, the first pressure range is lower than or equal to $1E^{-3}$ Pa. Preferably, if the temperature of the tip is higher than or equal to 500 K and lower than or equal to 800 K, the first pressure range is lower than or equal to $10^{-6}$ Pa; or, if the temperature of the tip is lower than or equal to 150 K, the first pressure range is lower than or equal to $10^{-6}$ Pa.

Figure 2A:
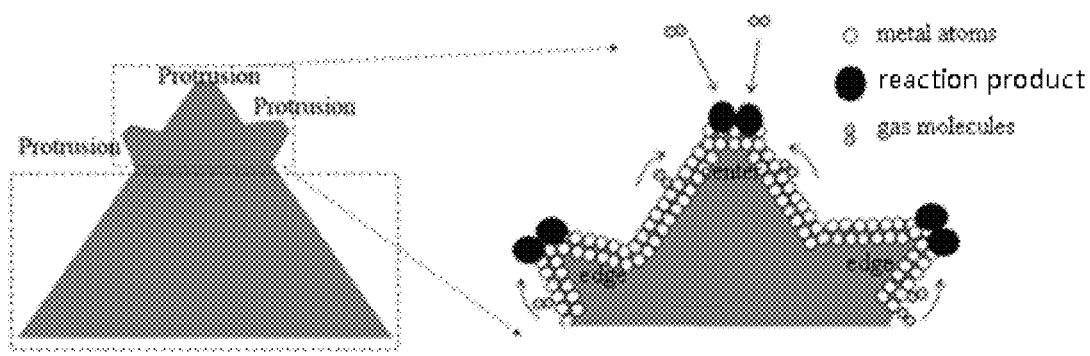
FIG. 2A schematically illustrates a schematic view of movement of gas molecules on a tip surface and formation of emission sites on protrusions in accordance with an embodiment of the present disclosure.

FIG. 2A schematically illustrates a schematic view of movement of gas molecules on a surface of a needle tip and formation of emission sites on protrusions in accordance with an embodiment of the present disclosure.

As shown in FIG. 2A, a protrusion is self-formed in situ at the needle tip (left figure of FIG. 2A), the gas molecules near the tip gradually move to the surface of the protrusion under an electric field. Due to the high-field-strength advantage of the protrusion, the gas molecules preferentially form a reaction product with the metal atoms on the surface of the protrusion, and the reaction product is fixed on the surface of the protrusion as an emission site. The structure shown by the black solid circle in the right figure is the reaction product (emission site) of the metal atom on the surface of the protrusion with the gas molecules.

The regenerated electron source can operate under the following conditions. It needs to be used in a vacuum environment, for example, the degree of vacuum will be lower than $1E^{-3}$ Pa, and preferably, the degree of vacuum is lower than $1E^{-6}$ Pa. The electron source will operate at a working temperature at which the emission site, the active region, the surface metal atoms and the protrusions do not disappear, for example, the working temperature for the reaction product of the tungsten atom and the gas molecules will be lower than 1,000 K. Preferably, the working temperature is a low temperature lower than 150K, or is a high temperature of 500~800K. When the temperature of the tip is higher than 1,000K, the formed emission site will be removed. The electron source can emit electrons when be applied with a certain electric field having, for example, a field strength of 1 to 30 V/nm.

Figure 2B:
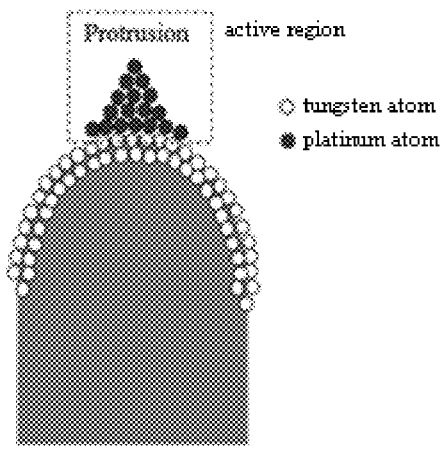
FIG. 2B schematically illustrates a schematic view of an example, in which a material type of a protrusion is different from a material type of a base, according to an embodiment of the present disclosure.

FIG. 2B schematically shows a schematic view of an example where a material type of a protrusion is different from a material type of a base according to an embodiment of the present disclosure. As shown in FIG. 2B, the surface of the base is a tungsten atomic layer, and a protrusion is formed by platinum atoms on the tungsten atom layer.

It should be noted that the protrusion self-formed on the tip of the electron source may be located only at an axial center position of the surface of the tip, or may be located at the edge of the tip in addition to the axial center position of the surface; the position of the protrusion may be set according to the crystal characteristics or the user's use requirements and will not limited herein (for example, it is also possible that there are protrusions at the edge, and there is no protrusion at the axial center position of the surface of the tip); the electron source obtained before regeneration or the electron source obtained after regeneration can be used directly, for example, the regenerated electron source may be applied with an electric field so as to emit a current. In addition, for the tip having the protrusion at the edge thereof, the regenerated electron source may be used after being processed, for example, after removing some emission sites not located at the axial center position of the surface of the tip.

Figure 3A:
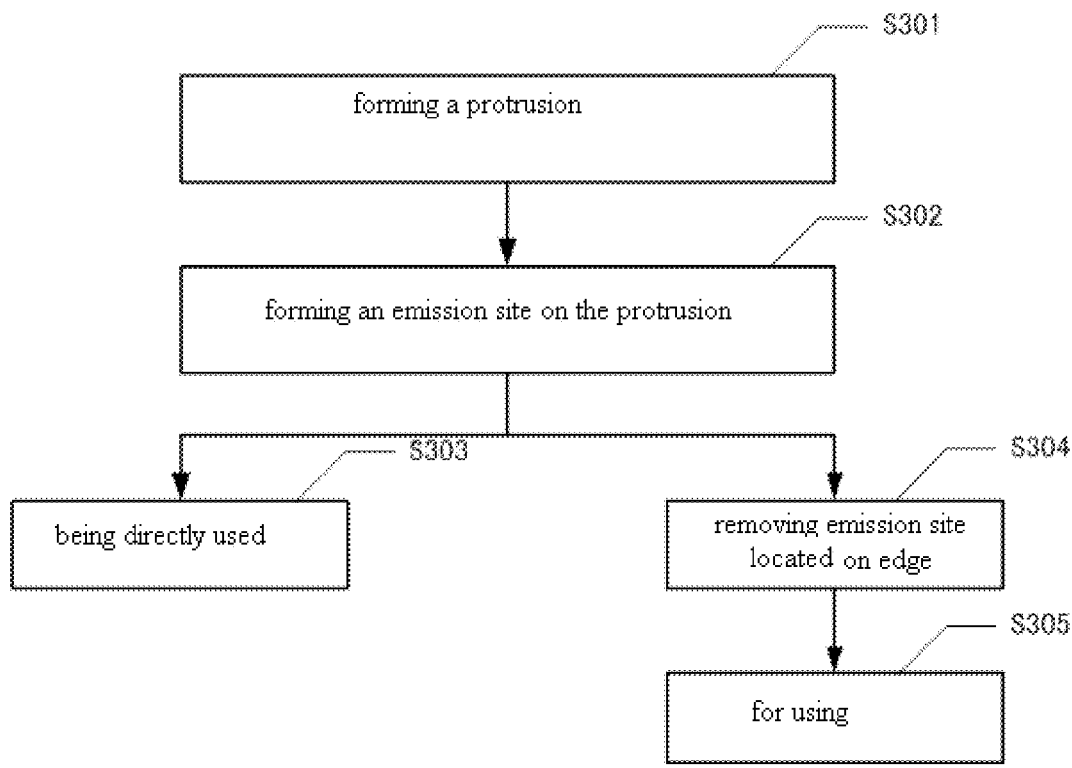
FIG. 3A schematically illustrates a flow diagram of electron source regeneration and use in accordance with an embodiment of the present disclosure.

FIG. 3A schematically illustrates a flow diagram of regeneration and use of an electron source in accordance with an embodiment of the present disclosure.

As shown in FIG. 3A, in an embodiment, the electron source regeneration method may include operations S301 to S303.

In operation S301, a protrusion is firstly self-formed on the base. The protrusion of the tip may be formed by heating, biasing, or a combination thereof, and the formed protrusion may be shown in the left diagram of FIG. 2A; the heating temperature at which the protrusion is formed is higher than 1,000K. If the protrusion is formed by applying a bias voltage, the bias voltage may be a positive bias voltage having a value less than a voltage for field evaporation, and the surface field intensity will be less than 50 V/nm; the bias voltage may also be a negative bias voltage, and the surface field intensity will be less than 30 V/nm.

In operation S302, an emission site is then formed on the protrusion to complete the regeneration process of the electron source (as shown in the right figure of FIG. 2A). A method of forming an emission site on a protrusion may be referred to the method of forming an emission site as described above.

Figure 3B:
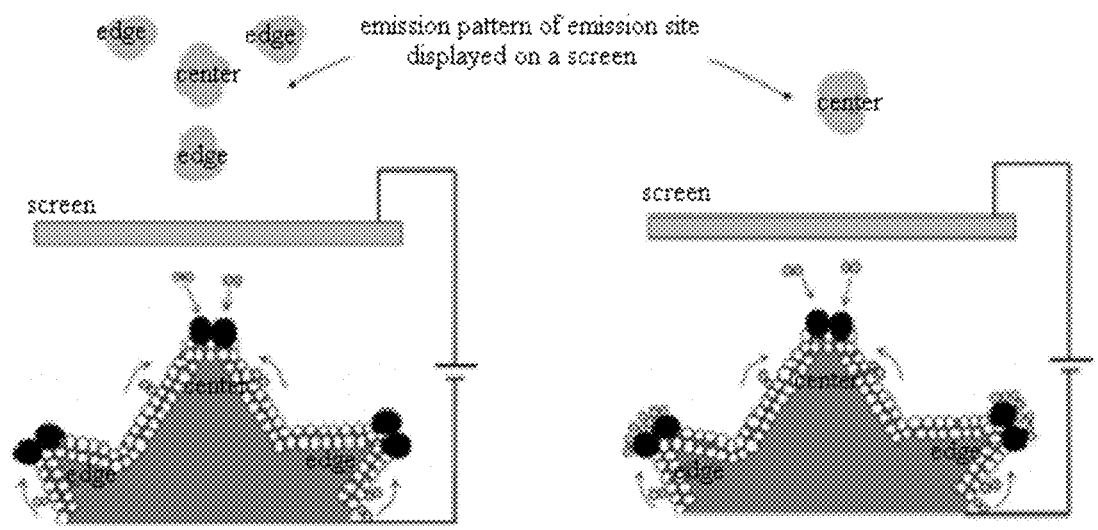
FIG. 3B schematically illustrates a schematic diagram of removing emission sites on a non-central protrusion in accordance with an embodiment of the present disclosure.

In operation S303, the regenerated electron source is directly used, as shown in the left figure of FIG. 3B.

As shown in FIG. 3A, in another embodiment, the electron source regeneration method may include an operation S301, an operation S302, an operation S304, and an operation S305.

The operation S301 and operation S302 are the same as those described in the previous embodiment, and will not be described in detail here.

In operation S304, before or after regenerating the electron source in situ, by applying an operating voltage to the electron source, gas molecules are adsorbed on the emission site to remove at least one emission site that is not located at the axial center position of the surface of the tip. This helps to form an emission pattern with a small area in the axial direction, as shown in the right figure of FIG. 3B.

The method of the embodiment shown in FIG. 3A is applicable to both the pre-regenerated and post-regenerated electron sources, that is, the electron source formed for the first time (means the pre-regenerated electron source) can also be formed and used in this manner.

FIG. 3B schematically illustrates a schematic diagram of removing emission sites on a non-central protrusion in accordance with an embodiment of the present disclosure.

As shown in FIG. 3B, since the field strength at the tip top of the electron source is higher than the field strength of the body of the electron source, the gas molecules on the surface of the electron source will move towards the tip top, during which they first move through the surface of the protrusion at the edge. The field strength at the protrusion structure on the tip top is higher than the field strength at the rest of the tip. Therefore, when the gas molecules move to the surface of the protrusion at the edge, they will be firstly adsorbed onto the protrusion at the edge. These gas molecules adsorbed on the protrusions will reduce the emission ability of the emission sites on the protrusions at the edge, and the emission ability will even disappear at the edge, so that the emission site which is not desired can be removed from the edge.

As shown in FIG. 3B, the bottom of the left figure is an electron source with a clean surface, where the emission site at the center of the surface of the protrusion and the emission site at the edge of the surface of the protrusion do not adsorb any gas molecule, and the emission pattern of the electron source is shown as the top of the left figure, where both the emission site on the central protrusion and the emission site on the edge protrusion have emission patterns, but the emission patterns are not concentrated enough. At the bottom of the right figure, gas molecules are adsorbed on the emission site on the surface of the edge protrusion, which causes the emission ability of the emission site on the surface of the edge protrusion to decrease. As the number of the adsorbed gas molecules increases, the emission ability of the emission site on the surface of the edge protrusion almost disappears. As the gas molecules are preferentially adsorbed on the edge protrusions due to its bottom-up movement, the emission site on the surface of the central protrusion still does not adsorb the gas molecules, and the emission capability of the emission site on the surface of the central protrusion does not disappear, so that the emission pattern shown as the top of the right figure appears. This effectively removes unwanted edge emission patterns. The presence and disappearance of edge emission sites can be judged by observing the field emission pattern or monitoring the edge current.

Figure 3C:
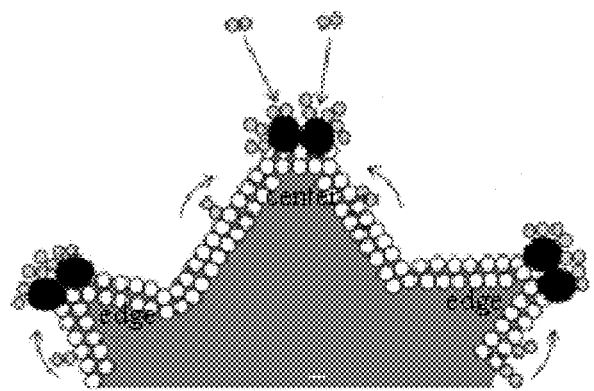
FIG. 3C schematically illustrates a schematic diagram of a decrease and degradation in emission capability of an emission site on a central protrusion, in accordance with an embodiment of the present disclosure.

FIG. 3C schematically illustrates a schematic diagram of a decrease and degradation in emission capability of an emission site on a central protrusion, in accordance with an embodiment of the present disclosure.

As prolonging the working time, the central protrusions will gradually adsorb thereon gas molecules, causing the emission ability of the emission site on the central protrusion to decrease or even degrade. Therefore, the electron source regeneration method can be used to regenerate the electron source.

Figure 4:
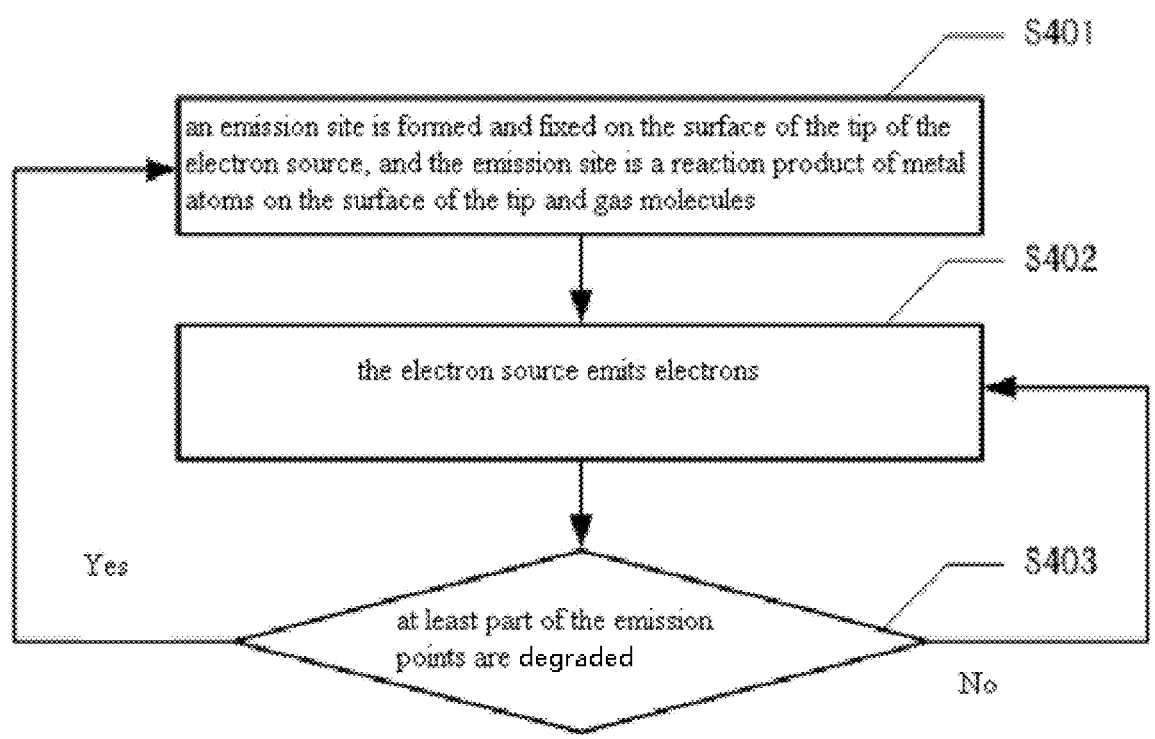
FIG. 4 is a flow chart that schematically illustrates repeated use of an electronic source through repeated regeneration in accordance with an embodiment of the present disclosure.

FIG. 4 is a flow chart that schematically illustrates repeated use of an electronic source through repeated regeneration in accordance with an embodiment of the present disclosure. Specifically, when the electron source regenerated in situ satisfies the regeneration condition, the electron source is regenerated in situ again.

As shown in FIG. 4, in order to achieve reusability of the electron source after degradation, the method may include following operations S401 to S403.

In operation S401, an emission site is formed and fixed on the surface of the tip of the electron source, and the emission site is a reaction product of metal atoms on the surface of the tip and gas molecules. The details may refer to the embodiment described above.

In operation S402, the electron source emits electrons. Specifically, the electron source can be applied with a negative bias voltage so as to emit a current.

In operation S403, if at least part of the emission sites is degraded, the step of regeneration is performed, for example operation S401 is performed; and if the emission site is not degraded, operation S402 may be performed. In this way, the reuse of the electron source can be realized, so that when the emission site of the electron source is degraded, the electron source can be regained with normal current emission capability by regeneration.

In another embodiment, the method may further comprise a step of heat treating the electron source prior to regenerating the electron source in situ.

Specifically, heat treatment is performed on the electron source before or after the electron source emits electrons, and/or heat treatment is performed when the electron source emits electrons.

In an example, before or after the electron source emits electrons, the heat treatment for the electron source may include any one or more of the following methods: continuous heat treatment or pulse heat treatment. That is to say, in a state where the electron source is not emitting, it may be subjected to continuous heating treatment or pulse heating treatment. Or, in the state in which the electron source is emitting electrons, it is also possible to carry out continuous heating treatment or pulse heating treatment on the electron source.

In a specific embodiment, the continuous heat treatment may include the following operations: firstly, the electron source is heated continuously (by using a low-voltage power supply or in other heating manner), wherein the heating temperature is lower than the least one of temperature where the base of the electron source disappears, temperature where the metal atoms on the surface of the tip disappears and temperature where the emission site disappears; or if the emission site is on a high-field-strength structure of the base of the electron source, the heating temperature is lower than the least one of temperature of where the base of the electron source disappears, temperature where the metal atoms on the surface of the tip disappears and temperature where the emission site and the high-field-strength structure disappears; and then the temperature of the electron source is maintained until the first set time period is reached. Preferably, in the case of using a reaction product of tungsten atoms and gas molecules as an emission site, the temperature of the electron source may be lower than or equal to 800 K, and the first set period may be less than or equal to 20 minutes.

Among others, the limitation to the heating temperature can effectively prevent the emission site, the metal atoms on the surface of the tip, the high-field-strength structure or the tip body from being damaged. The first set duration may be determined according to actual use effects, and the first set duration is also related to the material type of the metal atoms on the surface of the tip, the material type of the high-field-strength structure, or the like. For example, if the material of the metal atoms on the surface of the tip or the material of the high-field-strength structure has a higher melting point, the metal atoms and the high-field-strength structure on the surface of the tip will be less susceptible to the heat treatment, as long as the heat treatment does not cause the emission site to disappear.

It should be noted that during the heat treatment process, for example, during the continuous heat treatment process, the tip may be applied with a bias voltage, the emission capability may be avoided from being changed due to deformation of the tip structure (e.g., a high-field-strength structure).

In an example, the bias voltage applied to the electron source may include any one or more of the following: a positive bias voltage, a negative bias voltage, or a combination of a positive bias voltage and a negative bias voltage.

Specifically, if the positive bias voltage is applied, the value of the positive bias voltage is less than the voltage value for the field evaporation of the emission site; or if the negative bias voltage is applied, the value of the negative bias voltage is less than the voltage value corresponding to a first emission current threshold of the electron source (e.g., no excessive emission current will be generated).

In the continuous heat treatment mode, the heating temperature may be lower than about 800K. The needle tip is heated in a temperature range of less than about 800 K, for example by applying a current (which may have a current value of about several amperes) to a hairpin. This process usually lasts for a few minutes (e.g., 0.1~20 minutes), and can also be extended for the specific conditions of the needle tip.

Further, in the above-mentioned continuous heating operation, it may be still possible to cause damage to the protrusion of tip. In particular, the cumulative effect of long-term heat treatment eventually leads to deformation of the protrusion of tip, resulting in a significant drop in the emission capability. During an experiment, when studying experiment results, it was found that the tip deformation can be effectively avoided by applying a certain degree of bias (voltage) to the needle tip during heat treatment. There may be two modes: the first one is a mode of applying a positive bias voltage (for example, its typical value may be 0.5~2 kV), and because there is no field emission current, the further adsorption of gas moleculars on the tip due to electron excitation degassing can be avoided, but the absolute value of the maximum voltage when applying the positive bias voltage should be less than the voltage for field evaporation of the emission site on the surface of the tip; the second one is to apply a negative bias voltage, which has a voltage range that should be controlled so that the field emission of the tip is not significant, otherwise the emitted electrons will excite degassing, which in turn causes the adsorption to continue. Specifically, the typical value of the negative bias voltage applied may be −0.5 kV to −1 kV.

In another specific embodiment, the pulse heat treatment may include the following steps: first, heating the electron source in a pulsed manner by using a low-voltage power supply, wherein the pulse width is less than or equal to a pulse width threshold, and the interval between the pulse widths is greater than or equal to an interval duration threshold. Specifically, a heating temperature will be less than the least one of temperatures of where the base of the electron source disappears, temperature where the metal atoms on the surface of the tip disappears and temperature where the emission site disappears; or if the emission site is located on a high-field-strength structure on the base of the electron source, the heating temperature will be lower than the least one of temperatures of where the base of the electron source disappears, temperature where the metal atoms on the surface of the tip disappears and temperature where the emission site and the high-field-strength structure disappear.

For example, the temperature of the electron source is higher than or equal to 500K and lower than or equal to 1,000K, the pulse width threshold is less than or equal to 10 s, and the interval duration threshold is greater than or equal to 3 s; or, the temperature of the electron source is higher than or equal to 800K and lower than or equal to 1,000K, the pulse width threshold is greater than or equal to 2 s and less than or equal to 3 s, and the interval duration threshold is greater than or equal to 3 s.

Further, similar to the electron source may be applied with a bias voltage in the continuous heating treatment mode, the electron source may be also applied with a bias voltage in the pulse heat treatment.

Specifically, the applying bias voltage to the electron source includes any one or more of the following: applying a positive bias voltage, applying a negative bias voltage, or a combination of applying a positive bias voltage and applying a negative bias voltage. If the positive bias voltage is applied, the value of the positive bias voltage is less than the voltage value corresponding to the field evaporation of the emission site; or if the negative bias voltage is applied, the value of the negative bias voltage is lower than the voltage value corresponding to a first emission current threshold of the electron source. For example, the value of the positive bias voltage is greater than or equal to 0.5 KV and less than or equal to 2 KV, and the value of the negative bias voltage is greater than or equal to −1 KV and less than or equal to −0.5 KV.

In the pulse heating treatment mode, the bias voltage may or may not be applied. In an example, a moderate temperature heat pulse treatment mode can be adopted. F example, in a heating temperature range from 500K to 1,000K (the heating temperature may be different from the continuous heating temperature, and the pulse heating mode may provide a temperature slightly higher than the continuous heating mode). For example, the electron source may be heated by passing a current through a hairpin. In this temperature range, each heating pulse may last for a period less than 10 s, for example, 2 to 3 seconds, and multiple pulses may be processed. In order to avoid mutual interference between a preceding pulse and a posterior pulse, the interval time between adjacent pulses may be increased, and is generally greater than 3 seconds. The moderate temperature heat pulse treatment may be supplemented with a bias voltage (the bias voltage may be positive or negative). In addition, the application period of the bias voltage may be the same as the pulse period of the pulse heat treatment, or the bias voltage may be also applied during a part or all of the pulse treatment, which will not be limited herein.

In the above-mentioned pulse heat treatment operation, damage may be caused to the protrusion of the tip. In particular, the cumulative effect of long-term treatment eventually will lead to deformation of the protrusion of the tip, resulting in a significant drop in the emission capability. The tip deformation can be effectively avoided by applying a certain degree of bias (voltage) to the tip during heat treatment. Specifically, the following two modes may be used: in a first mode, a positive bias voltage (typically 0.5 to 2 kV) may be applied, and the absolute value of the maximum voltage would be less than the voltage value for the field evaporation of the emission site (e.g., the H-W reaction product) on the surface of the tip; in a second mode, a negative bias voltage may be applied, and its voltage range will be controlled so that the field emission of the tip is not significant; otherwise, the emitted electrons will excite degassing, which will continue to cause ion bombardment. When a negative bias voltage is applied, its typical value may be −0.5 kV to −1 kV.

In general, ion bombardment is a more serious problem that is common existed in the emission process. This problem exists even in a small emission current and a good vacuum state, but the effect is only slight, and it is impossible to avoid it fundamentally. If it is not heat treated in time, the life expectancy is hard to exceed 24 hours. It has been found through experiments that at the initial stage of the production of such dissociated substances, the dissociated substances may be detached from the surface of the tip by a higher temperature treatment (for example, at a temperature higher than bout 700 K), wherein the higher the temperature is, the more adequate the treatment is. However, long-term high temperature treatment will cause the emission site to disappear. In addition, since the emission sites are formed on the protrusions sized in nano-scale order, these protrusions are also gradually deformed at the high temperature, resulting in a decrease in emission capability, that is, a higher operating voltage is required. However, the gas molecules adsorbed on the surface of the tip and the above-mentioned dissociated substances can be effectively removed by the heat treatment method as described above, and the deformation of the protrusions can be avoided, and a decrease in the emission ability of the electron source due to increase of use time can be improved.

Through the operation mode of the tip (operating-heat treatment-operating-heat treatment cycle mode) as described above, an electron source as described above may be continuously operated for more than 1000 hours, which greatly improves the service life of the electron source while still maintaining a good emission state, for example, the increase of the extraction voltage is only less than 200 volts when compared to the extraction voltage applied at the beginning.

Since the heat treatment process is mainly a desorption process of gas molecules while it can also remove dissociated particles formed by ion bombardment or dissociation, without damaging one or more of the body, the base, the high-field-strength structure, the active region, the surface metal atoms and the emission site of the electron source, the heat treatment process has little or no damage to the electron source, and then may be preferably used to restore the emission capability of the electron source.

In still another embodiment, the method may further include: after performing heat treatment on the electron source, performing a repairing operation on the emission site of the electron source if the emission capability of the electron source satisfies an emission site repairing condition. In an example, the performing a repairing operation on the emission site of the electron source includes: removing the emission site of the electron source, and forming a new emission site on a surface of the protrusion or the active region having a greater activity. It should be noted that the heat treatment process may not be performed, and rather, the treatment is performed directly by repairing the emission site.

The emission site repairing condition may be set as: the current emission capability of the electron source after the heat treatment is decreased by more than a certain ratio or reaches a set threshold value with relative to the current emission capability of the new electron source.

Specifically, the performing a repairing operation on the emission site of the electron source may include: firstly removing at least one emission site on the surface of the tip of the electron source, and then forming a new emission site on the surface of the tip, the new emission site being a reaction product of metal atoms on the surface of the tip and gas molecules under the electric field. The method of forming a new emission site may be referred to the method for forming a new emission site in the above embodiment, and details thereof are not described herein again.

In a specific embodiment, the removing at least one emission site on the surface of the tip of the electron source may include, for example, removing at least one emission site on the surface of the electron source by heating or field evaporation; in an example, when removing at least one emission site on the surface of the electron source by heating, the heating temperature is lower than the least one of temperatures of where the base of the electron source disappears, temperature where the metal atoms on the surface of the tip disappears and temperature where the emission site disappears; or if the emission site is on a high-field-strength structure of the base of the electron source, the heating temperature is lower than the least one of temperatures of where the base of the electron source disappears, temperature where the metal atoms on the surface of the tip disappears and temperature where the emission site and the high-field-strength structure disappear.

It should be noted that, during the heating process, the electron source may be applied by a bias voltage, and the bias voltage applied to the electron sources may be any one or more of the following: applying a positive bias voltage, applying a negative bias voltage or a combination of applying a positive bias voltage and applying a negative bias voltage.

During removing at least one emission site on the surface of the electron source through field evaporation, the value of the positive bias voltage applied for the field evaporation is lower than a minimum value of the positive bias voltage under which metal atoms on the surfaces of the base and the tip of the electron source disappear; or, if the emission site is on a high-field-strength structure of the base of the electron source, the value of the positive bias voltage applied for the field evaporation is lower than a minimum value of the positive bias voltage under which metal atoms on the surfaces of the base and the tip of the electron source and of the high-field-strength structure disappear.

For example, firstly, the degraded emission site on the surface will be removed by heat treatment with increased temperature and the number of operation times (e.g., hundreds of operation times) for each pulse heat treatment, or the degraded emission site on the surface may be removed by applying a positive bias voltage (the value of which will not be that used for complete evaporation of the protrusion); the emission site may be formed again on the surface of the tip in the manner of regeneration. However, it should be noted that the temperature of the heat pulse should not exceed 1,000K, otherwise it will easily lead to the destruction of the protrusion on the surface of the tip, which will cause requirement of a new electron source. It should be noted that the most reliable method for extending the use time is to operate the electron source under high vacuum (lower than $10^{-7}$ Pa). If the vacuum degree is worse, the operating current must be reduced to ensure the running time.

In still another embodiment, the method may further include an operation of regenerating the electron source in situ after repairing the emission site of the electron source, if the emission capability of the electron source satisfies the regeneration condition. That is, if the above heat treatment and the above-mentioned emission site repairing operation fail to restore the electron source to a normal emission capability, the regeneration method as described above may be further employed, for example a protrusion of the tip may be re-formed in situ by heating, by biasing or by a combination thereof, and then a new emission site is formed again on the protrusion of the tip so as to emit a current, so that the electron source returns to its normal emission capability. FIG. 4 will be exemplarily illustrated in a specific embodiment.

Regarding the Process of Manufacturing the Electron Source

A tip used for manufacturing an electron source (preferably, the radius of curvature of the tip is in the order of nanometers) is placed in a vacuum environment, the degree of vacuum may be $1E^{-7}$ Pa; a protrusion is formed at a certain position on the tip by heating, by biasing or by a combination thereof, as shown in the left figure of FIG. 2A, and the heating temperature may be higher than 1,000K; the bias voltage may be a positive bias voltage, which has a value less than that of the voltage for the field evaporation, and the surface field intensity will be less than 50 V/nm; the bias voltage may be also a negative bias voltage, and the surface field intensity will be less than 30 V/nm.

The tip has a clean surface and the temperature of the tip is adjusted to be lower than 1,000K. Preferably, the temperature at the tip is a low temperature lower than 150K or a high temperature in a range of 500–800K. If the temperature of the tip is higher than 1,000K, the formed emission site will be removed; a bias voltage is applied on the surface of the protrusion such that under the action of a certain electric field, the metal atoms on the surface of the tip react with the gas molecules to form an emission site, as shown in the right figure of FIG. 2A. The specific formation method of the emission site may be as the same as described above, and the emission pattern of the formed electron source may be as shown in the left figure of FIG. 3B.

Regarding the Use of Electron Source

The electron source shown in the left figure of FIG. 3B has a peripheral edge emission site, and the electron source can be directly used to emit a current. During continuous use, due to gas adsorption, the ability to emit current of the edge emission site will drop and age, as shown in the right figure of FIG. 3B. Continuing to use, the central emission site's ability to emit current will gradually decline or even degrade, as shown in FIG. 3C.

The electron source shown in the right picture of FIG. 3B is firstly continuously operated or laid aside, waiting for degrading of the current emitting ability of the peripheral edge emission site, so that only the center emission site can be used after the emission; then, only the central emission site emits a current; with continuous use, the current emitting ability of the central emission site will also gradually decrease or even age, as shown in FIG. 3C.

Regarding regeneration of the electron source after the emission capability is reduced or degraded.

In one embodiment, the electron source as shown in the left or right figure of FIG. 3B can be recovered by a heat treatment method when the emission capability thereof is decreased, that is, the emission current capability at the same voltage is lowered; or, a high-field-strength structure such as a protrusion may be formed in situ by heating or by biasing or by a combination thereof, and then a new emission site is formed on the protrusion to emit a current, thereby realizing regeneration of the electron source.

In another embodiment, the electron source shown in the left or right figure of FIG. 3B, when its emission capability is degraded, as shown in FIG. 3C, that is, the emission current drops to an unrecoverable state under the same voltage, may be recovered by using the method of repairing the emission site as described above; or, a high-field-strength structure and/or an active area, such as protrusions and/or highly active metal atoms, may be formed in situ by heating or by biasing or by a combination thereof, and then a new emission site is formed on the surface of the structure and/or the active region to emit a current, thereby realizing regeneration of the electron source.

In another embodiment, the electron source as shown in the left or right figure of FIG. 3B, when emission capability could not be recovered by the method of repairing the emission site, can be regenerated by forming a high-field-strength structure and/or an active region in situ, such as protrusions and/or highly active metal atoms, by heating or by biasing or by a combination thereof, and then forming a new emission site on the surface of the structure and/or the active region to emit a current.

In other words, the conditions for regeneration of the electron source can be customized according to user's requirements.

By the above method, a cycle of "manufacturing-using-manufacturing-using . . . " of the tip can be achieved.

It will be appreciated by those skilled in the art that the various embodiments of the present disclosure and/or the various features recited in the claims may be combined or integrated, even if such combinations or integrations are not explicitly described in the present disclosure. In particular, the various embodiments of the present disclosure and/or the various features recited in the claims may be combined or integrated without departing from the spirit and scope of the present disclosure. All such combinations and/or integrations fall within the scope of the present disclosure.

The embodiments of the present disclosure have been described above. However, the embodiments are merely for illustrative purposes and are not intended to limit the scope of the present disclosure. Although the various embodiments have been described above, this does not mean that the measures in the various embodiments cannot be advantageously used in combination. The scope of the present disclosure is defined by the appended claims and their equivalents. Numerous alternatives and modifications may be made by those skilled in the art without departing from the scope of the present disclosure, and such alternatives and modifications should fall within the scope of the present disclosure.

What is claimed is:

1. A method of regenerating a field emission electron source, the field emission electron source comprising at least one first emission site fixed on a needle tip, the first emission site including a reaction product formed by metal atoms and gas molecules under an electric field, the at least one first emission site is rooted in a surface of the needle tip, rather than dissociative on the surface of the needle tip, the method comprising:
   in response to an emission capability of the field emission electron source satisfying a regeneration condition, regenerating the field emission electron source in situ to form a reaction product formed by metal atoms and gas molecules under an electric field;
   wherein the regenerating the field emission electron source in situ comprises:
   self-forming a protrusion in situ at the needle tip by heating, applying a bias voltage, or a combination thereof responsive to the emission capability of the field emission electron source satisfying the regeneration condition, wherein an outer surface of the protrusion includes the metal atoms; and
   forming a second emission site on the outer surface of the protrusion, wherein the second emission site includes a reaction product formed by the metal atoms and the gas molecules; or
   wherein the regenerating the field emission electron source in situ comprises:
   forming a highly-reactive active region in situ on a base of the needle tip responsive to the emission capability of the field emission electron source satisfying the regeneration condition, wherein an outer surface of the highly-reactive active region includes the metal atoms; and
   forming a second emission site on the outer surface of the highly-reactive active region, wherein the second emission site includes a reaction product formed by the metal atoms and the gas molecules.

2. The method of claim 1, wherein the protrusion has a size of an order of magnitude of a sub-nanometer to 100 nanometers.

3. The method of claim 1, wherein a material of the protrusion comprises same as or different from a material of which the base is made, and/or the needle tip has a material that is capable of self-forming the protrusion at a specified orientation, and/or the metal atoms of the outer surface of the protrusion are formed by an electroplating and/or evaporation process.

4. The method of claim 1,
   wherein the second emission site is formed by applying an electric field to the needle tip in a hydrogen-containing atmosphere within a first pressure range,
   wherein a temperature of the needle tip is lower than or equal to 1000K and the first pressure range is lower than or equal to $1E^{-3}Pa$, or the temperature of the needle tip is higher than or equal to 500K and lower than or equal to 800K and the first pressure range is lower than or equal to $10^{-6}Pa$, or the temperature of the needle tip is lower than or equal to 150 K and the first pressure range is lower than or equal to $10^{-6}Pa$.

5. The method of claim 1, further comprising:
   before or after regenerating the field emission electron source in situ, applying an electric field to the field emission electron source to cause the gas molecules to be adsorbed on the first emission site to remove at least one first emission site that is not at an axial position of a surface of the needle tip.

6. The method of claim 1, further comprising:
when the field emission electron source regenerated in situ satisfies the regeneration condition, regenerating the field emission electron source in situ again.

7. The method of claim 1, further comprising:
performing a heat treatment on the field emission electron source prior to regenerating the field emission electron source in situ.

8. The method of claim 7, further comprising:
after performing the heat treatment on the field emission electron source, repairing the first emission site of the field emission electron source responsive to an emission capability of the field emission electron source satisfying a emission site repairing condition,
wherein the repairing the first emission site of the field emission electron source comprises:
  removing at least one first emission site on a surface of the field emission electron source; and
  forming a new emission site on the outer surface of the protrusion or the highly-reactive active region.

9. The method of claim 8, further comprising:
after repairing the first emission site of the field emission electron source, regenerating the field emission electron source in situ to form a reaction product formed by metal atoms and gas molecules under an electric field responsive to the emission capability of the field emission electron source still satisfying the regeneration condition.

* * * * *